(12) United States Patent
Kim et al.

(10) Patent No.: US 7,245,547 B2
(45) Date of Patent: Jul. 17, 2007

(54) POWER DETECTOR FOR USE IN A NONVOLATILE MEMORY DEVICE AND METHOD THEREOF

(75) Inventors: Myong-Jac Kim, Gyeonggi-do (KR); Ji-Ho Cho, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 246 days.

(21) Appl. No.: 10/919,965

(22) Filed: Aug. 16, 2004

(65) Prior Publication Data

US 2005/0134250 A1  Jun. 23, 2005

(30) Foreign Application Priority Data

Dec. 22, 2003 (KR) ............ 10-2003-0094486

(51) Int. Cl.
*G11C 5/14* (2006.01)
(52) U.S. Cl. ............ 365/226; 365/189.07; 365/189.11
(58) Field of Classification Search ............ 365/189.09, 365/189.11, 189.07, 204, 194, 185.18, 185.25, 365/201, 226; 713/300; 307/64, 112
See application file for complete search history.

(56) References Cited

U.S. PATENT DOCUMENTS

| 5,212,442 A | * | 5/1993 | O'Toole et al. ............ 324/73.1 |
|---|---|---|---|
| 5,280,420 A | | 1/1994 | Rapp |
| 5,420,505 A | | 5/1995 | Kondo |
| 5,430,402 A | * | 7/1995 | Tedrow et al. ......... 365/185.23 |
| 6,333,517 B1 | * | 12/2001 | Tamaki ....................... 257/48 |
| 6,580,312 B1 | * | 6/2003 | Kim ........................... 327/536 |
| 2001/0033195 A1 | | 10/2001 | Kanda et al. |
| 2002/0196672 A1 | | 12/2002 | Honma et al. |
| 2006/0109729 A1 | * | 5/2006 | Yaoi et al. .................. 365/226 |

* cited by examiner

*Primary Examiner*—Richard Elms
*Assistant Examiner*—Douglas King
(74) *Attorney, Agent, or Firm*—Marger Johnson & McCollom, P.C.

(57) ABSTRACT

A nonvolatile memory cell operates without a time delay in an external power mode using an external power source. A power detector includes high voltage generators for generating voltages to a target level in response to a high voltage enable signal. A high voltage level detector detects attainment of the generated voltages to their respective target levels in response to an internal power mode signal generated in an internal power mode, and outputs a first detection signal. An external power mode detector outputs a second detection signal for an operation of the nonvolatile memory cell in response to an external power mode signal generated in an external power mode, and outputs the second detection signal in response to the first detection signal in the internal power mode.

17 Claims, 6 Drawing Sheets

POWER DETECTOR FOR USE IN A NONVOLATILE MEMORY DEVICE AND METHOD THEREOF

CROSS REFERENCE TO RELATED APPLICATIONS

This application claims priority from Korean Patent Application No. 2003-94486, filed on Dec. 22, 2003, the contents of which are hereby incorporated by reference for all purposes.

BACKGROUND OF THE INVENTION

1. Field of the Invention

This disclosure relates to a nonvolatile memory device, and more particularly, to a power detector for use in a flash memory device.

2. Description of the Related Art

A semiconductor memory device is generally classified into either a volatile memory for which stored information expires by a power failure, or a nonvolatile memory in which the stored information is preserved even with a power failure. The nonvolatile memory may further be classified into an EPROM(Erasable Programmable Read Only Memory), an EEPROM(Electrically Erasable Programmable Read Only Memory) or a flash memory. The flash memory has advantages over the EPROM and the EEPROM, while employing the drive principle of the EPROM when programming data, and employing the drive principle of the EEPROM when erasing the data. In the flash memory the size of the chip is relatively small compared with the EEPROM, thus the flash memory is more usable for high-integration and high capacity, and has an advantage of instantly updating information in a system, etc.

The flash memory requires a relatively high voltage in comparison to the power source used for programming and erasing data. For example, in the programming operation a high voltage of about 10V, or about 5V to 6V, is required, and in the erasing operation a high voltage of about 6V is required. Thus, the flash memory device requires a high voltage generating circuit for generating voltages high in comparison with a power source of about 3V. The high voltage generating circuit for generating high voltage is disclosed in U.S. Pat. No. 5,280,420.

FIG. 1 is a block diagram of an external power apparatus for use in a nonvolatile semiconductor memory device that is provided with a high-voltage generating circuit according to the conventional art. FIG. 2 is a timing diagram for the operation of a power detecting apparatus in an internal power mode according to the conventional art. FIG. 3 is a timing diagram for the operation of a power detecting apparatus in an external power mode according to the conventional art.

The configuration and operation of the power detecting apparatus will be described with reference to FIGS. 1 to 3 according to the conventional art.

Referring to FIG. 1, the power detecting apparatus includes high voltage generators 106a, 106b, 106c, a high voltage level detector 110 and a pulse generator 112. In order to describe the operation of the power detecting apparatus, a command register 102 and a program controller 104 are also shown in FIG. 1.

In the programming operation of the nonvolatile memory device, a program operation in response to command codes causes the command register 102 to generate a program enable signal PGM. The program controller 104 then generates a high voltage enable signal VPP_en, and the high voltage generators 106a, 106b, 106c respond by individually generating voltages VPP1, VPP2, VPP3, respectively, each having a target level. In response to either an internal power mode signal Mint or an external power mode signal Mext, the high voltage level detector 110 outputs a detection signal VPP_OK for the program operation when the voltages VPP1, VPP2, and VPP3 reach their respective target levels. Also, if any one of the voltages VPP1, VPP2, or VPP3 does not reach their respective target level within a predetermined time, t1, the high voltage level detector 110 outputs the detection signal VPP_OK at the end of the predetermined time. Finally, the pulse generator 112 generates a pulse signal HV_OK when the detection signal VPP_OK is enabled.

Referring to FIG. 2, a timing diagram for the case of the internal power mode, when the voltages (1: VPP1, VPP2, VPP3) generated in the high voltage generators reach their respective target levels, the high voltage level detector 110 outputs the detection signal VPP_OK. But when any one of the voltages (2: VPP1, VPP2, VPP3) does not reach their respective target level within a predetermined time, t1, the high voltage level detector 110 also outputs the detection signal VPP_OK, but only after a lapse of the predetermined time.

Referring to FIG. 3, for the case of the external power mode, similar to the case of the internal power mode, when the voltages (3: VPP1, VPP2, VPP3) reach their respective target levels, the high voltage level detector 110 outputs the detection signal VPP_OK. But when any one of the voltages (4: VPP1, VPP2, VPP3) does not reach their respective target level within a predetermined time, t1, the high voltage level detector 110 also outputs the detection signal VPP_OK, but only after a lapse of the predetermined time.

According to the conventional art, as in the case of the internal power mode, a high voltage level detection is also performed in the external power mode. Thus if any one of voltages generated in the high voltage generators does not reach a target level, the high voltage level detector outputs a detection signal for a program operation only after a lapse of a predetermined time. This results in unnecessary time and power loss in the external power mode using an external power source.

SUMMARY OF THE INVENTION

Some embodiments of the invention provide a power detector for use in a nonvolatile memory device, and a method thereof, in which a high voltage level detection is not performed for an external power mode using an external power source, enabling the nonvolatile memory cell to operate without a time delay. Herewith, time and power loss are reduced.

Furthermore, according to other embodiments of the invention, a power detector and method thereof can shorten a test time for a test mode using an external power source by eliminating the time delay. This reduces the loss of power for a test operation.

BRIEF DESCRIPTION OF THE DRAWINGS

The above and other features of exemplary embodiments of the invention will become readily apparent from the description that follows, with reference to the attached drawings in which.

DETAILED DESCRIPTION OF THE INVENTION

Exemplary embodiments of the invention are more fully described in detail with reference to FIGS. 4 to 8. The invention may be embodied in many different forms and should not be construed as being limited to the exemplary embodiments set forth herein. Rather, these exemplary embodiments are provided so that this disclosure is thorough and complete, and to convey the concept of the invention to those skilled in the art.

Figure 1:
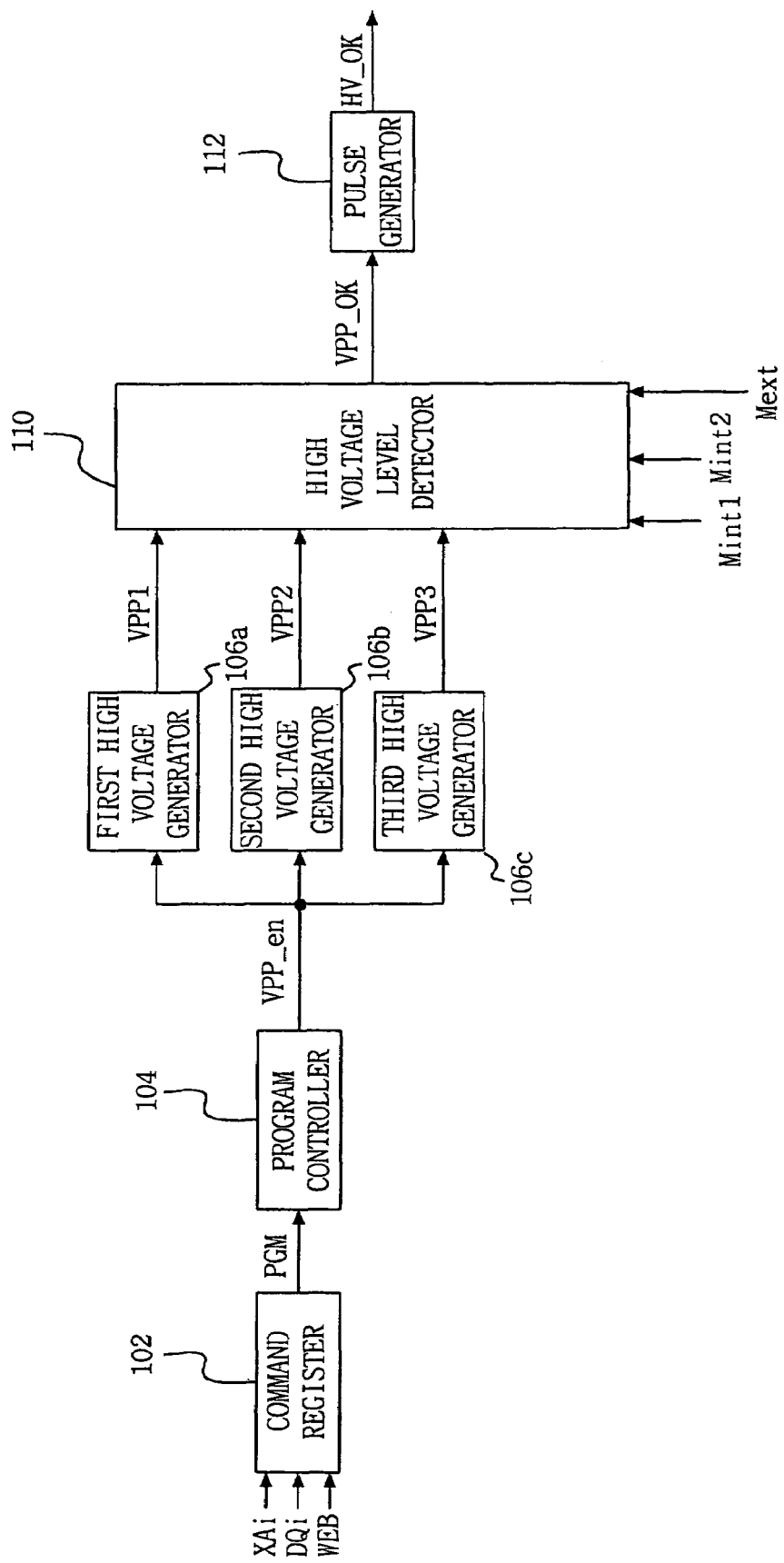
FIG. 1 is a block diagram of a power detector for use in a nonvolatile memory device according to the conventional art.
Figure 2:
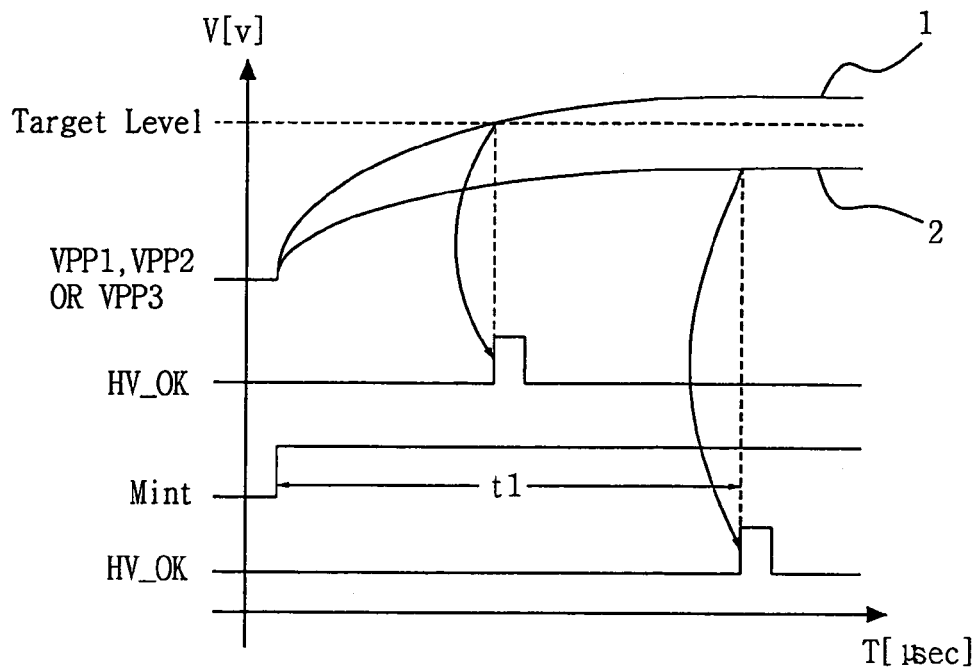
FIG. 2 is a timing diagram for an operation in an internal power mode of a power detector according to the conventional art.
Figure 3:
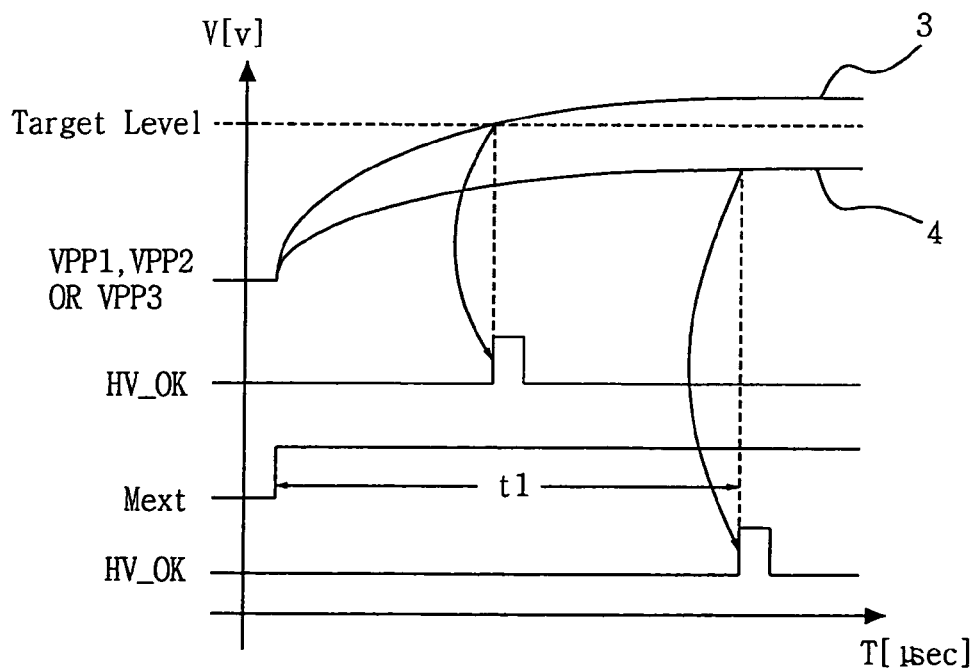
FIG. 3 is a timing diagram for an operation in an external power mode of a power detector according to the conventional art.
Figure 4:
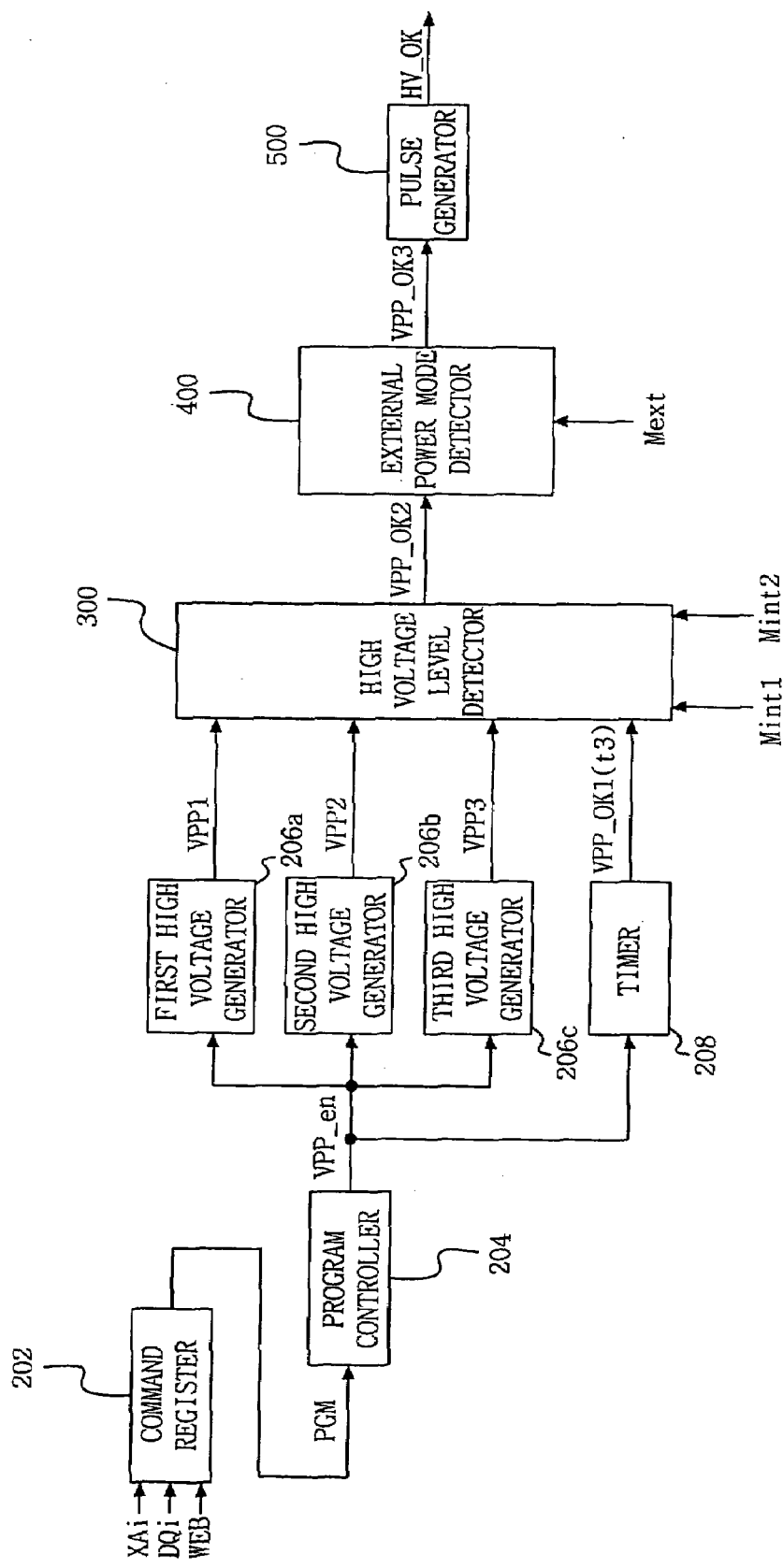
FIG. 4 is a block diagram of a power detector for use in a nonvolatile memory device according to an embodiment of the invention.
Figure 5:
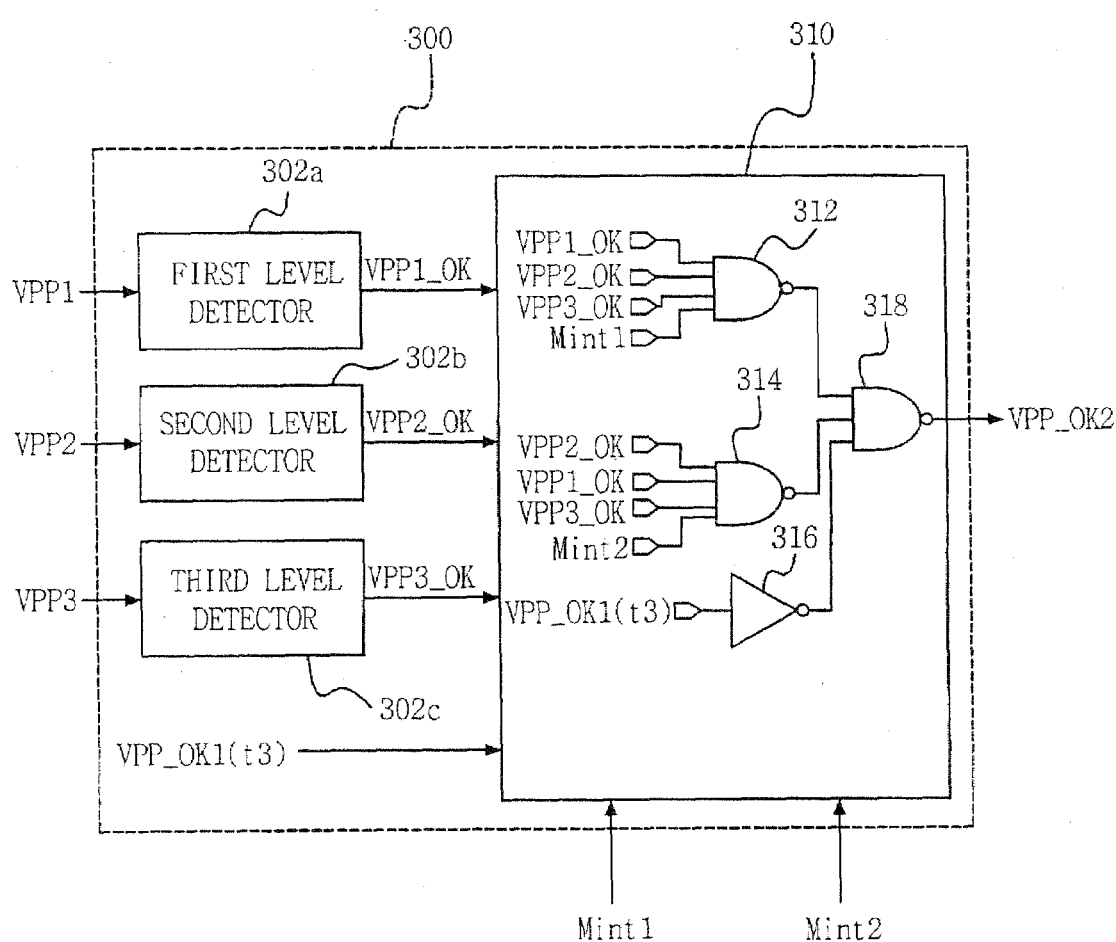
FIG. 5 is a circuit diagram of a high voltage level detector according to an embodiment of the invention.
Figure 6:
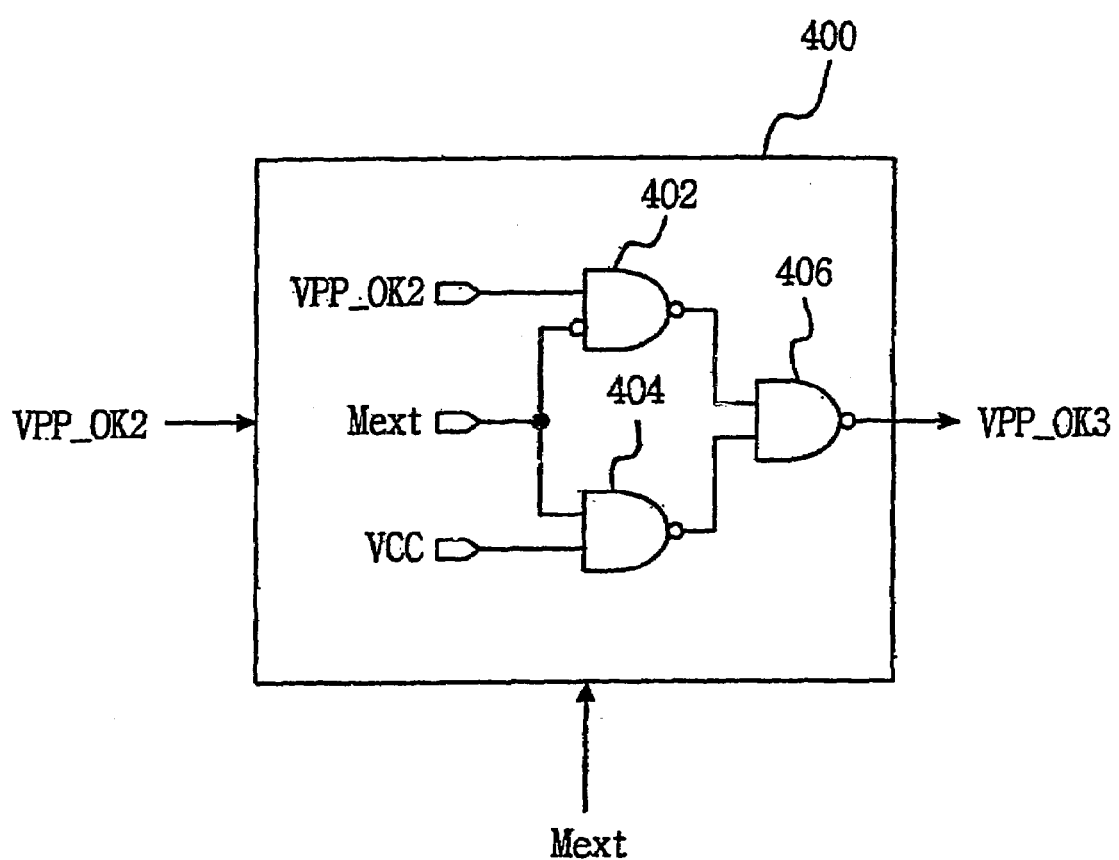
FIG. 6 is a circuit diagram of an external power mode detector according to an embodiment of the invention.

FIG. 4 is a block diagram illustrating the configuration of a power detector according to an embodiment of the invention. FIG. 5 is a circuit diagram of a high voltage level detector for use in the power detector according to an embodiment of the invention. FIG. 6 is a circuit diagram of an external power mode detector for use in the power detector according to an embodiment of the invention.

The configuration and operation of the power detector for use in the nonvolatile memory device will be described in detail with reference to FIGS. 4 to 6 according to an embodiment of the invention.

In FIG. 4, the power detector includes first through third high voltage generators 206a, 206b, 206c, a high voltage level detector 300, an external power mode detector 400, and a pulse generator 500. In order to describe an operation of the power detector according to an embodiment of the invention, there also are illustrated a command register 202 and a program controller 204.

In operating the nonvolatile memory in a program operation, command codes designated by address signals and data synchronize to a write enable signal WBB and are consecutively applied to the command register 202 for a determined cycle. The command register 202 generates a program enable signal PGM that informs of a program operation in response to the address signals and the data, namely, the command codes. The program controller 204 generates a high voltage enable signal VPP_en for enabling the first through third high voltage generators 206a, 206b, 206c in response to the program enable signal WEB generated in the command register.

The first through third high voltage generators 206a, 206b, 206c individually generate voltages VPP1, VPP2, VPP3 having respective target levels by a pumping operation in response to the high voltage enable signal VPP_en. Though there are shown three high voltage generators according to an embodiment of the invention, the number of high voltage generators may be changed in conformity with the number of target levels in the nonvolatile memory device.

The timer 208 outputs a control signal VPP_OK 1 after a lapse of a predetermined time t3 if any one of the voltages VPP1, VPP2, VPP3 generated in the first through third high voltage generators does not reach their respective target level by the predetermined time t3. t3 may be varied in conformity with usage and function, and may be determined to be between about 5 µs and 15 µs, for example.

The high voltage level detector 300 detects attainment of the voltages VPP1, VPP2, VPP3 to their respective target levels in response to the internal power mode signal Mint generated in the internal power mode, and outputs a first detection signal VPP_OK2. The high voltage level detector 300 also outputs the first detection signal VPP_OK2 when the control signal VPP_OK1 generated in the timer is detected after a lapse of the predetermined time t3. This will occur if any one of the voltages VPP1, VPP2, VPP3 generated in the first through third high voltage generators does not reach their respective target level by the predetermined time t3. Though the embodiment of the invention provides the separately configured timer and high voltage level detector, the timer 208 may be configured to be incorporated into the high voltage level detector.

The external power mode detector 400 outputs a second detection signal VPP_OK3 to perform an operation of a nonvolatile memory cell by either responsing to an external power mode signal Mext generated in the external power mode, or in response to the first detection signal VPP_OK2 generated in the internal power mode. Thus, the external power mode detector 400 does not perform a high voltage level detection in the external power mode, and this allows the second detection signal VPP_OK3 to be output without a time delay. That is, the external power mode detector 400 outputs the second detection signal VPP_OK3, without a time delay, in response to the external power mode signal Mext generated in the external power mode regardless of the level of the internal power source.

When the second detection signal VPP_OK3 from the external power mode detector is enabled, the pulse generator 500 generates a pulse signal HV_OK to perform the operation of the nonvolatile memory cell. The configuration and operation of the high voltage level detector 300 and the external power mode detector 400 will be described in detail, as follows.

With reference to FIG. 5, according to an embodiment of the invention, the high voltage level detector 300 for use in the power detector includes first through third level detectors 302a, 302b, 302c and a high voltage detection signal generator 310. Detectors 302a, 302b, 302c detect the voltages VPP1, VPP2, VPP3. Consequently, detectors 302a, 302b, 302c output respective control signals VPP1_OK, VPP2_OK, VPP3_OK if VPP1, VPP2, and VPP3 attain their respective target levels. In the embodiment of the invention, the number of high voltage generators is controlled by the number of target voltage levels in the nonvolatile memory, the number of level detectors may also be controlled by the number of target voltage levels.

Incorporating NAND gates 312, 314, and 318, the high voltage detection signal generator 310 outputs the first detection signal VPP_OK2 in response to the outputted control signals VPP1_OK, VPP2_OK, VPP3_OK and the internal power mode signal Mint generated in the internal power mode. The signal generator 310 outputs the first detection signal VPP_OK2 when the first internal power mode signal Mint1 is enabled and then when all the voltages reach first through third target levels. The first detection signal VPP_OK2 is also outputted when a second internal power mode signal Mint2 is enabled and the voltages reach the first through third levels. The determination for the first and second internal power modes is provided as an embodiment of the invention, and the internal power mode required in the nonvolatile memory device may be varied according to some cases. Also, the high voltage detection signal generator 310 detects, via the inverter 316, the control signal VPP_OK1 generated in the timer after a lapse of the predetermined time t3 if any one of the voltages required in the first or second internal power mode does not reach their respective target level, and then outputs the first detection signal VPP_OK2.

Referring to FIG. 6, according to an embodiment of the invention, the external power mode detector 400 includes first through third NAND gates 402, 404, 406. The first NAND gate 402 receives the first detection signal VPP_OK2 and an inverted signal of the external power mode signal Mext, and the second NAND gate 404 receives the external power mode signal Mext and the power source VCC. The third NAND gate 406 receives an output signal of the first and second NAND gates 402, 404 and outputs the second detection signal VPP_OK3. When the external power mode signal Mext is enabled in the external power mode, the external power mode detector 400 does not perform a high voltage level detection and generates the second detection signal VPP_OK3 without a time delay. In the internal power mode, the external power mode detector 400 also outputs the second detection signal VPP_OK3 in response to the generated first detection signal VPP_OK2.

Figure 7:
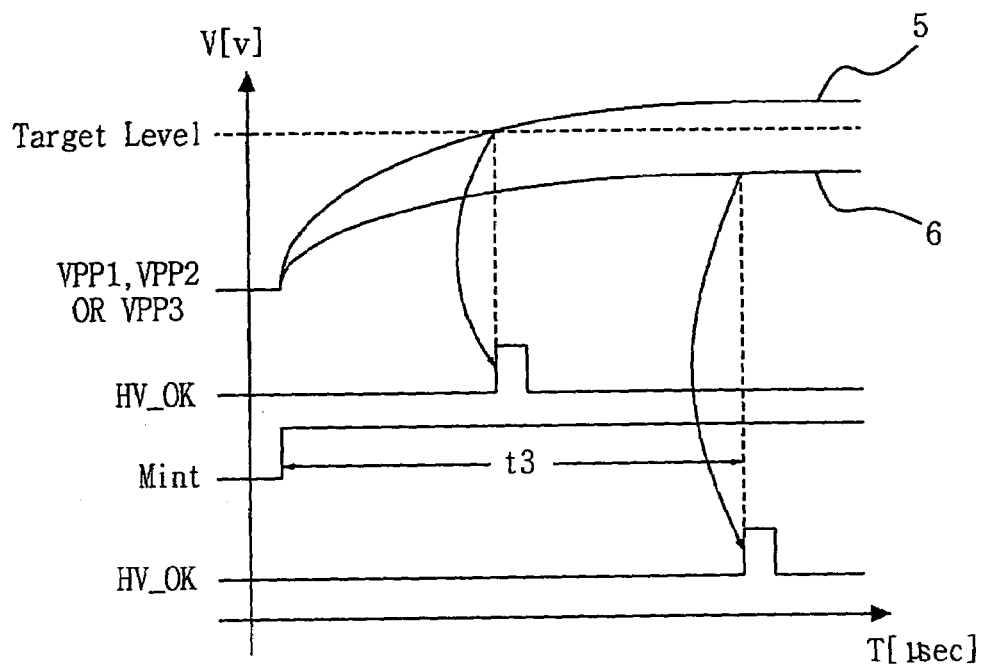
FIG. 7 is a timing diagram for an operation in an internal power mode of a power detector according to an embodiment of the invention.

FIG. 7 is a timing diagram for an operation in the internal power mode of the power detector according to an embodiment of the invention. Referring to FIG. 7, the operation of the power detector will be described in detail as follows.

In the internal power mode the program controller 204 generates the high voltage enable signal VPP_en, and in response to the generated high voltage enable signal VPP_en, the first through third high voltage generators 206a, 206b, 206c perform a pumping operation to individually generate the voltages VPP1, VPP2, VPP3 having respective target levels. Subsequently, the high voltage level detector 300 detects the voltages (5: VPP1, VPP2, VPP3) that are generated in the first through third high voltage generators and determines if they reach their respective target voltage levels (5). Then the first detection signal VPP_OK2 is output in response to both a control signal generated by the detection result and the internal power mode signal Mint, which is generated in the internal power mode. Meanwhile, when any one of the voltages (6: VPP1, VPP2, VPP3) does not reach their respective target level within the predetermined time, t3, the high voltage level detector 300 outputs the first detection signal VPP_OK2 at time t3. Next, the external power mode detector 400 outputs the second detection signal VPP_OK3 in response to the generated first detection signal VPP_OK2. Consequently, the pulse generator 500 generates a pulse signal HV_OK for an operation of the nonvolatile memory cell.

Figure 8:
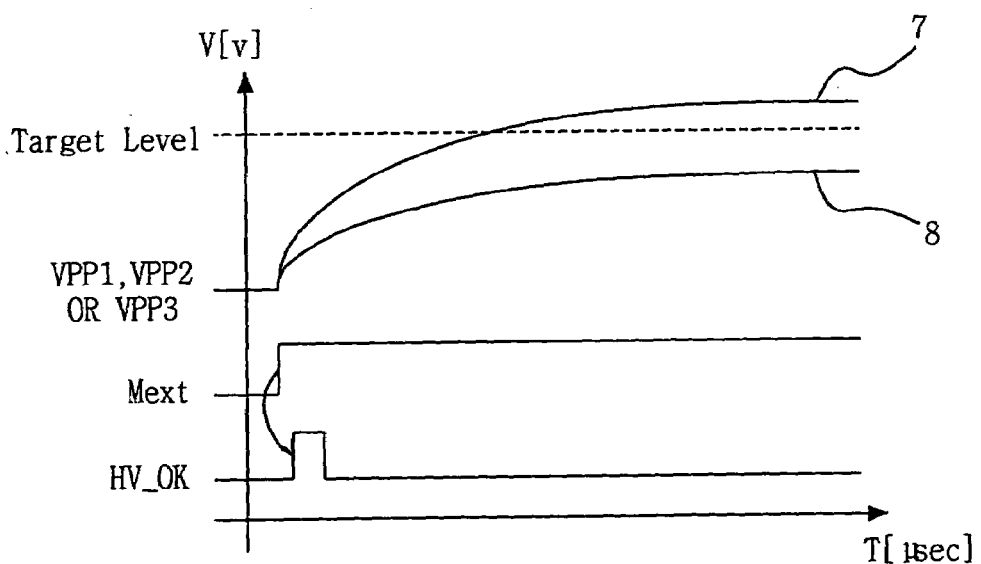
FIG. 8 is a timing diagram for an operation in an external power mode of a power detector according to an embodiment of the invention.

FIG. 8 is a timing diagram for an operation in the external power mode according to an embodiment of the invention. With reference to FIG. 8, the operation of the power detector will be described as follows.

Contrary to the internal power mode, and unlike that method practiced in the prior art, in the external power mode when the external power mode signal Mext is detected in the external power mode detector 400, the high voltage level detection is not performed and the external power mode detector 400 outputs the second detection signal VPP_OK3 for an operation of the nonvolatile memory cell without a time delay. Then, when the second detection signal VPP_OK3 outputted from the external power mode detector 400 is enabled, the pulse generator 500 generates the pulse signal HV_OK for an operation of the nonvolatile memory cell.

In summary, in the power detector according to the exemplary embodiment of the invention, when voltages generated in the high voltage generators reach a target level in the internal power mode, a second detection signal is generated, and when any one of the voltages generated in the high voltage generators does not reach the target level, the second detection signal is generated only after a lapse of a predetermined time. In an external power mode, the second detection signal for an operation of the nonvolatile memory cell is generated when an external power mode signal is detected in the external power mode detector. Hence, in the external power mode, not only when the power source reaches a target level but also when the power source does not reach the target level, the second detection signal is generated without the time delay, or test-time, that would occur in the internal power mode. That is, the high voltage level detection is not performed in the external power mode, using an external power source, which enables the nonvolatile memory cell to operate with a reduced time and power loss. In particular, in a test mode using an external power source, the detection signal HV_OK for a test operation is generated without the test-time delay, thereby shortening the test time and reducing the power loss.

As described above, according to embodiments of the invention, a high voltage level detection is not performed in an external power mode using an external power source, enabling a nonvolatile memory cell to operate without a time delay, thus reducing time and power loss.

Also, a test operation in a test mode using an external power source is performed without a time delay, thus reducing test time and power loss.

Embodiments of the invention may be practiced in many ways. What follows are exemplary, non-limiting descriptions of some of these embodiments.

An embodiment of the invention provides a power detector for use in a nonvolatile memory device, the power detector including high voltage generators for generating voltages having a target level in response to a high voltage enable signal; a high voltage level detector for detecting attainment of the generated voltages to their respective target levels in response to an internal power mode signal generated in an internal power mode, and for outputting a first detection signal; and an external power mode detector for outputting a second detection signal for an operation of a nonvolatile memory cell in response to an external power mode signal generated in an external power mode, and for outputting the second detection signal in response to the first detection signal in the internal power mode.

Herewith, the high voltage level detector includes level detectors for individually detecting attainment of voltages generated in the high voltage generator to target voltage levels, and for providing first control signals; a timer for providing a second control signal after a lapse of a predetermined time if any one of the voltages generated in the high voltage generator does not reach the target voltage level; and a high voltage detection signal generator for outputting a first detection signal in response to an internal power mode signal generated in the internal power mode, the first control signals, and the second control signal. Furthermore, the external power mode detector includes a first NAND gate for receiving the first detection signal and an inverted signal of the external power mode signal; a second NAND gate for receiving the external power mode signal and an external power source; and a third NAND gate for receiving an output from the first and second NAND gates and for outputting the second detection signal.

Another embodiment of the invention provides a power detector for use in a nonvolatile memory device, including high voltage generators for generating voltages having a target level in response to a high voltage enable signal; a timer for generating a control signal after a lapse of a predetermined time if any one of the generated voltages does not reach a target voltage level; a high voltage level detector, which responds to an internal power mode signal generated in an internal power mode, receives the voltages having the target level and the control signal and detects the voltages having the target level or the control signal, to generate a first detection signal; and an external power mode detector for outputting a second detection signal for an operation of a nonvolatile memory cell in response to an external power mode signal generated in an external power mode, and for outputting the second detection signal in response to the first detection signal in the internal power mode.

Another embodiment of the invention provides an external power mode detector for use in a power detector in a nonvolatile memory device in which an external power source is supplied in a test mode, the external power mode detector adapted to generate a detection signal for a test operation of the nonvolatile memory device without a delay of test time in response to an external power mode signal generated in the test mode.

Another embodiment of the invention provides a method for detecting the power source in a nonvolatile memory device, the method including generating voltages having a target level in response to a high voltage enable signal; outputting a first detection signal when the generated voltages reach the target level in response to an internal power mode signal generated in an internal power mode, and outputting the first detection signal after a lapse of a predetermined time if any one of the generated voltages does not reach the target voltage level; and outputting a second detection signal for an operation of a nonvolatile memory cell in response to an external power mode signal generated in an external power mode, and outputting the second detection signal in response to the first detection signal in the internal power mode.

Another embodiment of the invention provides a method for detecting an external power source in a power detecting method of a nonvolatile memory device in which the external power source is supplied for a test mode, the method including generating an external power mode signal in a test mode and generating a detection signal for a test operation of the nonvolatile memory device without a test time delay in response to the external power mode signal.

It will be apparent to those skilled in the art that modifications and variations can be made to the exemplary embodiments without deviating from the spirit or scope of the invention. Thus, it is intended that the invention cover any such modifications and variations of this invention provided they come within the scope of the appended claims and their equivalents. For example, an inventive power detector may be applied to a program operation or to an erasing operation etc. Accordingly, these and other changes and modifications are seen to be within the true spirit and scope of the invention as defined by the appended claims.

We claim:

1. A power detector for use in a nonvolatile semiconductor memory device powered by a power source, said power detector comprising:
   high voltage generators for generating a plurality of voltages, each having a respective target level in response to a high voltage enable signal;
   a high voltage level detector for detecting attainment of the generated voltages to the respective target level in response to an internal power mode signal generated in an internal power mode, and for outputting a first detection signal; and
   an external power mode detector for outputting a second detection signal for an operation of a nonvolatile memory cell in response to an external power mode signal generated in an external power mode in which an external power source is supplied, and for outputting the second detection signal in response to the first detection signal in the internal power mode.

2. The detector of claim 1, wherein the high voltage level detector outputs the first detection signal after a lapse of a predetermined time if any one of the generated voltages does not reach the respective target level.

3. The detector of claim 1, wherein the high voltage level detector comprises:
   high voltage level detectors for individually detecting attainment of the voltages generated in the high voltage generator to the respective target level, and for providing first control signals;
   a timer for providing a second control signal after a lapse of a predetermined time if any one of the voltages generated in the high voltage generator does not reach the respective target level; and
   a high voltage detection signal generator for outputting the first detection signal in response to the internal power mode signal generated in the internal power mode, the first control signals, and the second control signal.

4. The detector of claim 2, wherein the predetermined time is between about 5 µs and 15 µs.

5. The detector of claim 3, wherein the predetermined time is between about 5 µs and 15 µs.

6. The detector of claim 1, wherein the external power mode detector outputs the second detection signal without a time delay in response to the external power mode signal generated in the external power mode.

7. The detector of claim 1, wherein the external power mode detector outputs the second detection signal without a time delay in response to the external power mode signal generated in the external power mode regardless of a voltage level of the external power source.

8. The detector of claim 1, wherein the external power mode detector comprises:
   a first NAND gate for receiving the first detection signal and an inverted signal of the external power mode signal;
   a second NAND gate for receiving the external power mode signal and the power source; and
   a third NAND gate for receiving an output of the first and second NAND gates and for outputting the second detection signal.

9. The detector of claim 1, further comprising a pulse generator for generating a pulse signal when the second detection signal is enabled.

10. The detector of claim 1, wherein the voltages generated in the high voltage generator have a level higher than the power source.

11. A power detector for use in a nonvolatile semiconductor memory device having at least one nonvolatile memory cell in which an external power source is supplied in an external power mode, the detector comprising:

high voltage generators for generating a plurality of voltages each having a respective target level in response to a high voltage enable signal;

a timer for generating a control signal after a lapse of a predetermined time if any one of the generated voltages does not reach the respective target level;

a high voltage level detector, which responds to an internal power mode signal generated in an internal power mode, that receives the control signal and the voltages having the respective target levels, and detects the control signal or the voltages having the respective target levels to generate a first detection signal; and an external power mode detector for outputting a second detection signal for an operation of the nonvolatile memory cell in response to an external power mode signal generated in the external power mode, and for outputting the second detection signal in response to the first detection signal in the internal power mode.

12. The detector of claim 11, wherein the external power mode detector outputs the second detection signal without a time delay in response to the external power mode signal generated in the external power mode.

13. The detector of claim 11, wherein the external power mode detector outputs the second detection signal without a time delay in response to the external power mode signal generated in the external power mode regardless of a voltage level of the power source.

14. A method of detecting an external power source in a nonvolatile semiconductor memory device having at least one nonvolatile memory cell in which the external power source is supplied in an external power mode, the method comprising:

generating a plurality of voltages each having a respective target level in response to a high voltage enable signal;

outputting a first detection signal when the generated voltages reach the respective target levels in response to an internal power mode signal generated in an internal power mode, and outputting the first detection signal after a lapse of a predetermined time if any one of the generated voltages does not reach the respective target level; and outputting a second detection signal for an operation of the nonvolatile memory cell in response to an external power mode signal generated in the external power mode, and outputting the second detection signal in response to the first detection signal in the internal power mode.

15. The method of claim 14, wherein outputting the first detection signal comprises:

individually detecting attainment of the generated voltages to the respective target level, to provide a control signal;

providing the control signal after a lapse of a predetermined time if the voltages generated in the high voltage generator do not reach the respective target level; and outputting the first detection signal in response to the internal power mode signal generated in the internal power mode, the control signals, and a control signal provided from a timer.

16. The method of claim 14, wherein the predetermined time is between about 5 μs and 15 μs.

17. The method of claim 15, wherein the predetermined time is between about 5 μs and 15 μs.

* * * * *

UNITED STATES PATENT AND TRADEMARK OFFICE
CERTIFICATE OF CORRECTION

PATENT NO. : 7,245,547 B2
APPLICATION NO. : 10/919965
DATED : July 17, 2007
INVENTOR(S) : Kim et al.

It is certified that error appears in the above-identified patent and that said Letters Patent is hereby corrected as shown below:

Inventor's name "Myong-Jac" should read -- Myong Jae --;
Column 3, line 52, the word "WBB" should read -- WEB --.

Signed and Sealed this

Fifth Day of January, 2010

David J. Kappos
*Director of the United States Patent and Trademark Office*